United States Patent
Mattes et al.

(10) Patent No.: US 7,471,220 B2
(45) Date of Patent: Dec. 30, 2008

(54) ELECTRONIC TEST CIRCUIT FOR AN INTEGRATED CIRCUIT AND METHODS FOR TESTING THE DRIVER STRENGTH AND FOR TESTING THE INPUT SENSITIVITY OF A RECEIVER OF THE INTEGRATED CIRCUIT

(75) Inventors: Heinz Mattes, Munich (DE); Sebastian Sattler, Munich (DE)

(73) Assignee: Infineon Technologies AG, Munich (DE)

(*) Notice: Subject to any disclaimer, the term of this patent is extended or adjusted under 35 U.S.C. 154(b) by 22 days.

(21) Appl. No.: 11/622,779

(22) Filed: Jan. 12, 2007

(65) Prior Publication Data

US 2007/0176807 A1 Aug. 2, 2007

Related U.S. Application Data

(63) Continuation of application No. PCT/DE2005/001184, filed on Jul. 5, 2005.

(30) Foreign Application Priority Data

Jul. 16, 2004 (DE) ....................... 10 2004 034 606

(51) Int. Cl.
*H03M 1/10* (2006.01)
(52) U.S. Cl. ...................... 341/120; 375/225
(58) Field of Classification Search ............... 341/120; 375/225, 350; 331/16; 703/24; 455/102, 455/313
See application file for complete search history.

(56) References Cited

U.S. PATENT DOCUMENTS

| | | | |
|---|---|---|---|
| 5,761,212 A | 6/1998 | Foland, Jr. et al. | 371/21.2 |
| 5,781,025 A | 7/1998 | Sachdev et al. | 326/16 |
| 6,665,336 B2 * | 12/2003 | Abdelilah et al. | 375/225 |
| 6,762,614 B2 | 7/2004 | Rearick et al. | 324/763 |
| 6,859,059 B2 | 2/2005 | Rohrbaugh et al. | 324/763 |
| 7,323,945 B2 * | 1/2008 | Cyr et al. | 331/16 |
| 2003/0067869 A1 | 4/2003 | Harris et al. | 370/217 |

FOREIGN PATENT DOCUMENTS

| | | |
|---|---|---|
| DE | 10304880 A1 | 11/2003 |
| EP | 1283615 A2 | 5/2002 |
| JP | 01-228252 | 9/1989 |
| JP | 03-169127 | 7/1991 |
| JP | 04-056551 | 2/1992 |
| JP | 04-249733 | 9/1992 |
| KR | 010026004 A | 4/2001 |
| KR | 010048130 A | 6/2001 |
| WO | 97/02496 A2 | 1/1997 |
| WO | 00/62501 | 10/2000 |

OTHER PUBLICATIONS

Danger et al. "Efficient FPGA Implementation of Gaussian Noise Generator for Communication Channel Emulation" IEEE (pp. 366), 2000.

(Continued)

*Primary Examiner*—Howard Williams
*Assistant Examiner*—Joseph Lauture
(74) *Attorney, Agent, or Firm*—Banner & Witcoff, Ltd.

(57) ABSTRACT

The electronic test circuit for an integrated circuit to be tested has an input for receiving an analog data stream (23), a programmable digital line emulator ($TPE_1$) for emulating properties of a transmission path and an output for emitting an analog data stream (24) having a signal-to-noise ratio which can be adjusted using the programmable digital line emulator ($TPE_1$).

20 Claims, 4 Drawing Sheets

OTHER PUBLICATIONS

Fan et al. "A Versatile High Speed Bit Error Rate Testing Scheme" IEEE (1 page), 2004.

Arabi et al. "Oscillation Built-In Self Test (OBIST) Scheme for Functional and Structural Testing of Analog and Mixed-Signal Integrated Circuits" IEEE Design & Test of Computers (1 page), 1996.

Toner et al. "A BIST Scheme for a SNR, Gain Tracking, and Frequency Response Test of a Sigma-Delta ADC" IEEE Transactions on Circuits and Systems-II, Analog and Digital Signal Processing, vol. 42, No. 1 (pp. 1-15), Jan. 1995.

Wickert et al. "Implementation of Real-Time Frequency-Selective RF Channel Simulator Using a Hybrid DSP-FPGA Architecture" IEEE Transactions on Microwave Theory and Techniques, vol. 49, No. 8 (pp. 1390-1397), Aug. 8, 2001.

International Search Report and Written Opinion for International Application No. PCT/DE2005/001184 (8 pages), Jul. 5, 2005.

* cited by examiner

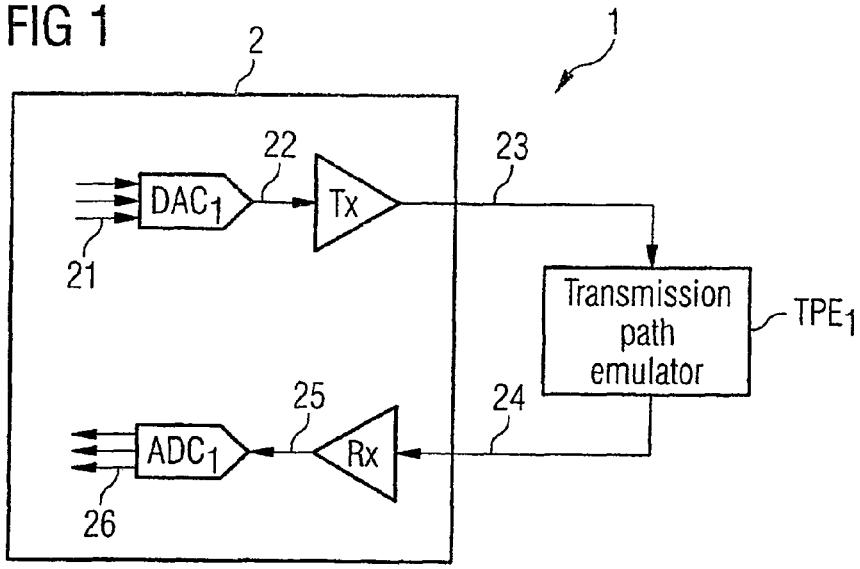
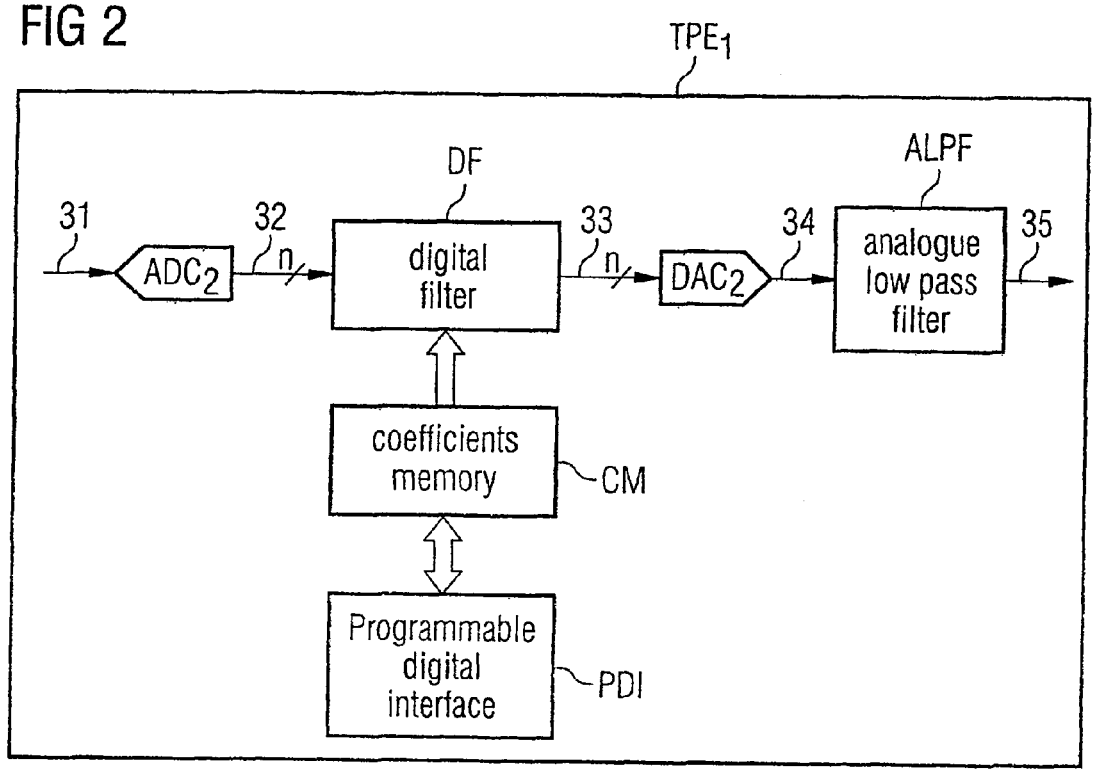

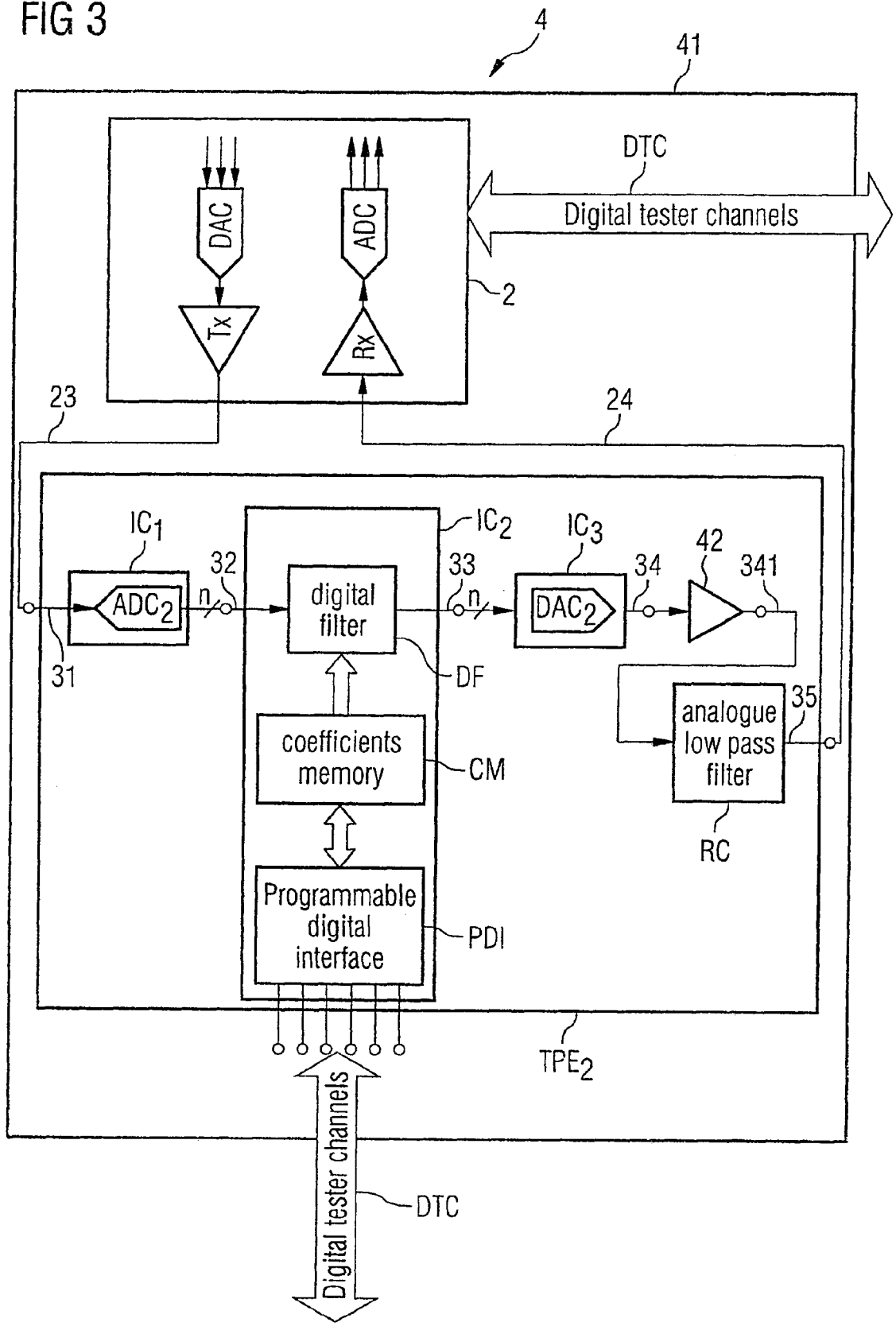

ELECTRONIC TEST CIRCUIT FOR AN INTEGRATED CIRCUIT AND METHODS FOR TESTING THE DRIVER STRENGTH AND FOR TESTING THE INPUT SENSITIVITY OF A RECEIVER OF THE INTEGRATED CIRCUIT

CROSS-REFERENCE TO RELATED APPLICATION

This application is a continuation of co-pending International Application No. PCT/DE2005/001184 filed Jul. 5, 2005, which designates the United States, and claims priority to German application number DE 10 2004 034 606.2 filed Jul. 16, 2004.

TECHNICAL FIELD

The invention relates to an electronic test circuit for an integrated circuit, to a method for testing the driver strength of an integrated circuit and to a method for testing the input sensitivity of a receiver of an integrated circuit.

BACKGROUND

Transceiver modules have a transmitter or driver and a receiver. Such transceiver modules are first of all subjected, in the characterization phase, to complicated and time-consuming measurements which can be used to determine whether they satisfy the prescribed specification. If a transceiver module has successfully passed through the characterization phase, it means that there are no errors caused by the circuit design and that the transceiver modules are accordingly within the prescribed specifications.

During the production phase of these transceiver modules, it is often impossible to check whether the transceiver modules comply with the specification parameters since these tests are very time-consuming and require very expensive tester equipment, with the result that transceiver modules are often not tested during production for reasons of cost and efficiency. Examples of such test methods are given in M. F. Toner, G. W. Roberts, "A BIST Scheme for a SNR, Gain Tracking and Frequency Response Test of a Sigma-Delta ADC", IEEE Trans. Circ. Syst. II, vol. 42, pp. 1-15, 1995 and K. Arabi, B. Kaminska, "Oscillation Built-in Self-test (OBIST) Scheme for Functional and Structural Testing of Analog and Mixed-Signal Integrated Circuits", IEEE Design & Test of Computers, 1996. Therefore, it cannot be precluded that, during the production process, individual transceiver modules or even entire batches will violate the prescribed specifications and thus become unusable as a result of unfavorable fluctuations in the process parameters coinciding.

JP 03-169127 shows a compensation circuit for a transceiver, in which parts of the transmitted signal are subtracted from the received signal. This circuit is not suitable as a test circuit for an integrated circuit.

SUMMARY

An electronic test circuit and test methods may be used to reduce the time expenditure and the tester equipment and, therefore, make it possible to check integrated circuits in a time-saving and cost-saving manner, in particular also in the test during production.

An electronic test circuit for an integrated circuit to be tested may comprise an input for receiving an analog data stream, a programmable digital line emulator for emulating properties of a transmission path, and an output for emitting an analog data stream having a signal-to-noise ratio which can be adjusted using the programmable digital line emulator, the input and output being selectively connected or being able to be selectively connected to an output and an input, respectively, of a transmitter/receiver for test purposes.

BRIEF DESCRIPTION OF THE DRAWINGS

The invention is illustrated in more detail in the drawings with reference to exemplary embodiments.

FIG. 1 shows a diagrammatic illustration of a first test arrangement having a first transceiver and a first programmable digital emulator, FIG. 2 shows an enlarged diagrammatic illustration of the first programmable digital emulator from FIG. 1, FIG. 3 shows a diagrammatic illustration of a second test arrangement having a first load board.

DETAILED DESCRIPTION

Figure 4:
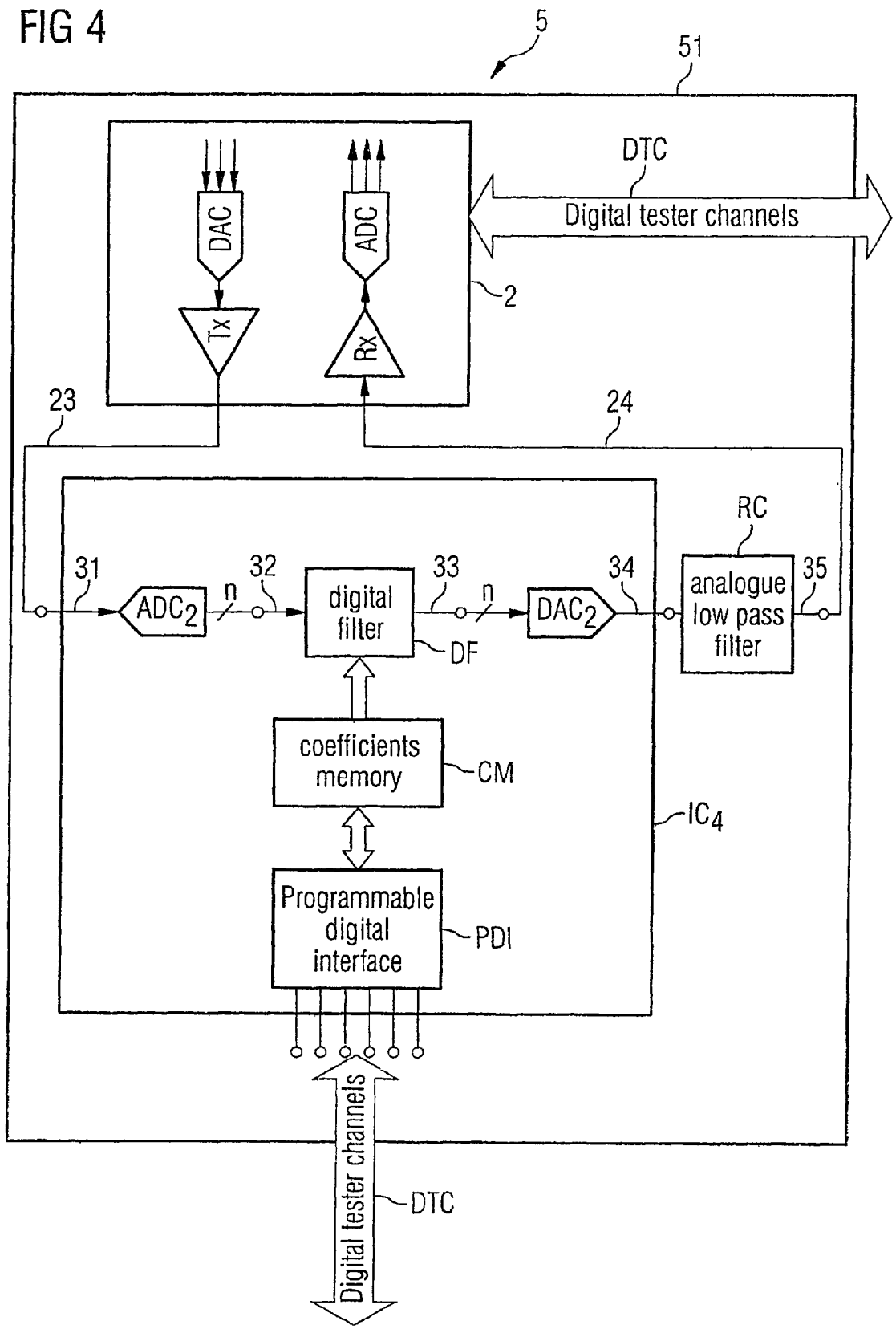
FIG. 4 shows a diagrammatic illustration of a third test arrangement having a second load board.

According to an embodiment, an electronic test circuit for an integrated circuit to be tested, in particular for a transceiver, is provided which has an input for receiving an analog data stream which, in particular, has been amplified, a programmable digital line emulator for emulating properties of a transmission path and an output for emitting an analog data stream having a signal-to-noise ratio which can be adjusted using the programmable digital line emulator.

Thus, according to different embodiments, a programmable digital module is inserted into a loop-back path of an integrated circuit to be tested, which module is able to deliberately emulate the properties of any desired transmission path, for example a connecting line or an RLC network. According to an embodiment, this programmable digital module which is in the form of a programmable digital line emulator is able to deliberately distort or shape a received analog data stream and thus to individually adjust the signal quality of the signal which is emitted and is applied to a data input of the integrated circuit to be tested. This makes it possible to test whether a bit error rate which is still permissible is achieved in the integrated circuit to be tested with a data stream which has been distorted in this manner. Such distortion can be used to generate tests which come very close to use in real transmission paths.

According to an embodiment, the electronic test circuit can be used to parametrically test mixed-signal modules, which, in contrast to purely digital electronic components, also have analog inputs and outputs, without having to use expensive mixed-signal testers. This makes it possible to considerably reduce the test costs. The analog inputs and outputs are generally specified by parameter sets on data sheets.

According to an embodiment of the electronic test circuit, the programmable digital line emulator has a digital filter through which a digital or digitized data stream passes. In this case, the coefficients of the digital filter can be selected by a user in such a manner that the data stream processed by the digital filter to form a digital data stream has the desired properties. The use of such a digital filter makes it possible to emulate a multiplicity of different transmission paths in a precise and simple manner.

According to an embodiment, another advantageous refinement of the electronic test circuit also provides a coefficients memory and a programmable digital interface which can be used to adjust the digital filter on a user-defined basis. The digital filter is programmed using the coefficients memory, the coefficients and the architecture of the filter determining the transfer function. In this case, according to an embodiment, the programmable digital interface can be connected to a tester which is in the form of a computer system, filter coefficients and control and status data being able to be interchanged between the programmable digital interface and the tester. This makes it possible to adapt and adjust the test parameters in a user-friendly and flexible manner even during the production test.

According to an embodiment, in order to be able to operate the digital filter with an integrated circuit which is to be tested and emits and receives analog data streams, the line emulator may have an analog/digital converter upstream of the digital filter and a digital/analog converter downstream of the digital filter. In this case, only minor demands need to be imposed on the resolutions of the AD converter and of the DA converter, with the result that such converters can be integrated in the line emulator in a very cost-effective manner.

If the programmable digital line emulator also has an analog low-pass filter, according to an embodiment, which is arranged downstream of the DA converter and is intended to process the received analog data stream to form a low-pass-filtered analog output data stream, the analog data stream, which may still contain interfering stages on account of the low resolution of the DA converter, is advantageously smoothed. The analog data stream at the output of the analog low-pass filter then has the same properties as a data stream which would have passed through a connecting line or an RLC network having the same filter coefficients. As a result, any desired connecting lines and RLC networks can be emulated in a precise and simple manner.

According to an embodiment, transceivers may be advantageously tested using the electronic test circuit if their drivers are connected to the input of the AD converter and their receivers are connected to the output of the analog low-pass filter.

This makes it possible to check transceivers, in particular their analog parameters, even during production without needing to carry out the tests, for example the measurement of an eye diagram, which are used in the characterization phase, require a very precise and expensive measuring apparatus and are exceptionally time-consuming. This is because transceivers are specified, inter alia, using analog parameters. Typical analog parameters for the driver of a transceiver are, for example, the driver strength, the output power, the edge steepness, the matching ratio and the jitter. The receiver of the transceiver is specified, for example, using its input sensitivity, its input dynamics and its jitter tolerance.

If a programmable amplifier is integrated in the analog signal path of the electronic test circuit downstream of the digital/analog converter or downstream of the analog low-pass filter, according to an embodiment, different parameters can be set by changing the parameters of the digital filter and by changing the gain of the programmable amplifier, as a result of which the operation of checking the integrated circuit to be tested, in particular the input sensitivity of its receiver, is improved further. This programmable amplifier may either be included in the digital/analog converter or may be in the form of an additional component downstream of the digital/analog converter or downstream of the analog low-pass filter.

The invention also relates to an integrated test circuit in which the above-described electronic test circuit having the digital filter, the coefficients memory and the programmable digital interface is monolithically integrated. According to an embodiment, the electronic test circuit can accordingly be combined in an integrated test circuit in particularly compressed fashion. In addition to the digital filter, the coefficients memory and the programmable digital interface, the AD converter and the DA converter may also be applied to the same integrated test circuit, thus resulting in a particularly space-saving single-chip solution. With such an integrated test circuit, the electronic test circuit may be implemented either with discrete components or with a single-chip solution as an external test structure, for example on the load board.

The invention also relates to any desired integrated circuit, in particular a transceiver, which has an electronic test circuit as described above. According to an embodiment, in this case, the electronic test circuit is monolithically integrated in this integrated circuit and, in addition to the actual circuit of the integrated circuit, is in the form of a built in self test (BIST). According to an embodiment, in this case, the AD converter, the DA converter and the analog low-pass filter of the electronic test circuit can be dispensed with since the electronic test circuit in this case is fitted in the digital signal path of the integrated circuit. The highest possible data rates can be achieved with this cost-effective on-chip solution. It is also suitable for use in high-speed interfaces. Only the direct connection between the transmitter and the receiver of the integrated circuit to be tested must then be established on the load board on which the integrated circuit to be tested is placed during testing. Apart from this, there is no need for any further components on the load board.

However, in this embodiment of the electronic test circuit, it is a prerequisite that the chip area required for this purpose is available. Sufficient chip area is generally available, in particular, in integrated circuits in which the switching area is limited only by the number of connection contacts to be applied.

According to one advantageous development of an embodiment, the digital filter including the coefficients memory and the programmable digital interface may be in the form of a field programmable gate array (FPGA) in the test circuit.

The invention furthermore relates to a load board having one or more test receptacles for testing integrated circuits or ICs or for holding semiconductor wafers. According to an embodiment, an automatic fitting machine fits such a load board with ICs or with semiconductor wafers in order to check them and said load board is connected to a tester for testing ICs or semiconductor wafers. In this case, the load board has an integrated test circuit as described above and an analog low-pass filter.

According to an embodiment, the test circuit can be implemented on the load board using a single-chip structure or else with discrete components, in which circuit the digital filter, the coefficients memory and the programmable digital interface are formed in a common integrated test circuit and the AD converter and the DA converter are formed in respective separate integrated circuits.

According to an embodiment, complete integration in a single-chip solution makes it possible to achieve far higher processing speeds than is the case with the discrete structure. In this case, the absolute maximum speed depends on the technology used.

The electronic test circuit, according to an embodiment, may also be integrated in the instrumentation of the tester used. A structure having discrete components or a single-chip structure may also be selected in the tester instrumentation.

According to different embodiments, the electronic test circuit described above can be implemented in different ways. The different versions of the electronic test circuit differ, on the one hand, in the choice of physical test plane and, on the other hand, in the version with discrete components or in the form of a single chip. Different cost savings can be achieved depending on the number of elements of the electronic test circuit which can be held in the integrated test circuit.

The invention also relates to a method for testing the driver strength of a driver of an integrated circuit to be tested, in particular of a transceiver, and to a method for testing the input sensitivity of a receiver of such an integrated circuit.

According to embodiments, in both methods, an above-described integrated electronic test circuit, which is present in an integrated test circuit, on a load board or in tester instrumentation, is first of all provided and is connected to the integrated circuit to be tested, or an integrated circuit which is to be tested and has an on-chip test circuit is provided and is connected to a load board.

According to an embodiment of the method for testing the driver strength, the programmable digital line emulator, in particular the digital filter, is then adjusted to a particular load behavior by programming it with the desired parameters using the programmable digital interface and the coefficients memory, so that it correctly emulates the desired load. That is to say, the driver must be able to drive a particular load, so that the resulting signal is still correctly detected by the receiver. This may be a nonreactive load, a capacitive load or a transmission line.

Data are then applied to the driver of the integrated circuit to be tested and the analog data stream is detected by the receiver of the integrated circuit to be tested. This can be used to determine the bit error rate of the integrated circuit. If a prescribable maximum bit error rate is undershot in this operating state, the driver strength parameter is verified, including the properties of the receiver. If this prescribable maximum bit error rate is exceeded, the integrated circuit to be tested is sorted out.

According to an embodiment of this method, the data stream received by the receiver is used, in accordance with a reciprocal network, to draw conclusions regarding the driver strength applied by the driver. The driver strength of a driver of an integrated circuit to be tested can be checked in a simple and cost-effective manner using this method without complicated analog tester equipment having to be available. The quality of the analog received signal is not observed during the test but may be generated by means of simulation and represented in the form of an eye diagram when creating the test data.

According to an embodiment of the method for testing the input sensitivity of a receiver, after the test apparatus and the integrated circuit to be tested have been provided, the programmable digital line emulator, in particular the digital filter, is adjusted in such a manner that a digital or digitized data stream is processed to form a digital data stream having a desired signal-to-noise ratio. That is to say, the receiver must be able to still correctly detect the signal up to a particular signal-to-noise ratio. In this case, the signal quality which can only just be discerned can be described, for example, by means of a worst case eye mark.

Data are then applied to the driver of the integrated circuit to be tested and the analog data stream is detected by the receiver of the integrated circuit to be tested, which data stream can be used to determine the bit error rate of the integrated circuit. If the maximum prescribable bit error rate is undershot in this operating state, the input sensitivity parameter is verified. If the prescribable maximum bit error rate is exceeded, the integrated circuit is sorted out.

The input sensitivity of a receiver of an integrated circuit to be tested can be checked in a simple and cost-effective manner using this method without complicated analog tester equipment having to be available. A set of filter coefficients for the line emulator can be obtained by means of simulations, so that the input signal at the receiver has the worst case eye at different driver powers.

In a first embodiment of the method for testing the input sensitivity of a receiver, if the electronic test circuit has a programmable amplifier, the amplifier power of the programmable amplifier is also adjusted after the programmable digital line emulator has been adjusted. This makes it possible to check the input sensitivity of the receiver in an improved manner.

In one embodiment of the two methods, the steps of applying data to the driver and detecting the analog data stream are carried out several times in succession, the driver power being gradually lowered or raised until the bit error rate exceeds the prescribed maximum value. In this case, the programmable digital line emulator is programmed, during the test, with the coefficients obtained from the simulation. Depending on whether the result is inside or outside the worst case eye mark, the receiver will or will not satisfy the specification and is correspondingly verified or sorted out. The use of such eye marks when testing integrated circuits is known to a person skilled in the art and does not need to be explained any further here.

The methods can be carried out using an electronic test circuit or an integrated circuit, using a load board and tester instrumentation, in which a respective electronic test circuit is present. The usage options are therefore extremely varied.

The use of the methods makes it possible to check a multiplicity of mixed-signal module types in a cost-effective manner, an expensive analog tester source being dispensed with and only a few digital channels for programming the digital filter being required instead.

According to an embodiment, moving the analog tester source from the tester to the load board or to the integrated circuit to be tested itself not only makes it possible to replace the mixed-signal tester but also provides the prerequisites for a multisite test especially since digital test patterns and stimuli, for example references, can easily be distributed to a plurality of integrated circuits in a parallel manner.

According to an embodiment, only a modification to the load board, which can be implemented in a relatively cost-effective manner, is required for integrated circuits having sampling rates of up to 100 MHz. The method can then be used even for existing integrated circuits.

According to an embodiment, a DFT measure in the integrated circuit is required for integrated circuits having higher sampling rates. Additional measures on the load board are not required in this case.

Types of integrated circuits whose test coverage can be improved using the proposed method are in the low-speed range, for example drivers, modules for vehicle buses.

In the higher-speed range, the method can be used to test high-speed interfaces, for example in a serial ATA, read/write channel or advanced memory buffer.

FIG. 1 shows a first test arrangement 1 having a first transceiver 2 to be tested and a first programmable digital emulator $TPE_1$.

The first transceiver 2 comprises a first digital/analog converter $DAC_1$, a driver or operational amplifier TX, a receiver RX, a first analog/digital converter $ADC_1$ and further elements which are not shown here for reasons of improved representation. The output of the driver TX is connected to the input of the first programmable digital emulator $TPE_1$ and the receiver RX is connected to the output of the latter.

A first digital data stream 21 is converted by the first DA converter $DAC_1$ into a first analog data stream 22, is amplified by the driver TX and is output in the form of an amplified analog data stream 23. This amplified analog data stream 23 forms the input for the first programmable digital emulator $TPE_1$ and is processed by the latter to form a distorted analog data stream 24 which is forwarded to the receiver RX. The receiver RX processes this distorted analog data stream 24 to form a second digital data stream 25 which is then processed by the first AD converter $ADC_1$ to form a second digital data stream 26.

The amplified analog data stream 23, the first programmable digital emulator $TPE_1$ and the distorted analog data stream 24 form a feedback loop or a loop-back path which is able to emulate specific properties of a transmission path, for example of a connecting line.

FIG. 2 shows an enlarged diagrammatic illustration of the first programmable digital emulator $TPE_1$.

A second AD converter $ADC_2$, a digital filter DF, a second DA converter $DAC_2$ and an analog low-pass filter ALPF are provided in the first programmable digital emulator $TPE_1$ in the signal path between the amplified analog data stream 23 and the distorted analog data stream 24.

The parameters of the digital filter DF are selected in such a manner that defined distortion is applied to a data stream which passes through the digital filter DF, so that the properties of a transmission line are emulated. The digital filter DF is connected to a coefficients memory CM which can be individually programmed using a programmable digital interface PDI. As a result, parameters for the digital filter DF and control and status data can be interchanged between the digital filter DF and a tester which is not shown in FIG. 2. The resolution of the second AD converter $ADC_2$ and of the second DA converter $DAC_2$ is low and is of the order of magnitude of 10 bits for a sampling rate of 105 mega samples per second (Msps).

The amplified analog data stream 23 from FIG. 1 forms the analog input data stream 31 which is converted by the second AD converter $ADC_2$ into a digitized data stream 32. The digitized data stream 32 passes through the digital filter DF, has defined distortion applied to it there and leaves said filter in the form of a digital data stream 33. The digital data stream 33 is then converted by the second DA converter $DAC_2$ into an analog data stream 34 which is then processed by the analog low-pass filter ALPF to form a smoothed or low-pass-filtered analog output data stream 35.

The low-pass-filtered analog output data stream 35 at the output of the first programmable digital emulator $TPE_1$ forms the distorted analog data stream 24 from FIG. 1 and has the same properties as a data stream which would have passed through a transmission line having the same filter parameters. The first programmable digital emulator $TPE_1$ thus approximates a transmission line, that is to say emulates it as exactly as possible.

FIG. 3 shows a second test arrangement 4 having a first load board 41.

The first transceiver 2 to be tested and a second programmable digital emulator $TPE_2$ are arranged on the first load board 41. The first transceiver 2 corresponds, in terms of its function and design, to that from FIG. 1 and is additionally connected to a conventional tester (not shown here) via digital tester channels DTC. Signals which correspond to data are fed to the first transceiver 2, and test values of the first transceiver 2 are transmitted to the tester for analysis and evaluation, via the digital tester channels DTC.

In this exemplary embodiment, the components of the second programmable digital emulator $TPE_2$ are formed in three different integrated circuits $IC_1$, $IC_2$ and $IC_3$. This is not absolutely necessary. The digital emulator $TPE_2$ may also be formed in fewer or more than three integrated circuits.

The second programmable digital emulator $TPE_2$ essentially corresponds, in terms of its components, to the first programmable digital emulator $TPE_1$, the second AD converter $ADC_2$ being formed in a first integrated circuit $IC_1$, the digital filter DF, the coefficients memory CM and the programmable digital interface PDI being formed in a second integrated circuit $IC_2$, and the second DA converter $DAC_2$ being formed in a third integrated circuit $IC_3$, and the analog low-pass filter ALPF being present, for example, in the form of an RC network RC.

A programmable amplifier 42 which is arranged in the analog signal path between the third integrated circuit $IC_3$ and the RC network RC and amplifies the analog data stream 34, which is generated by the second DA converter $DAC_2$, to form an analog data stream 341 is additionally provided in the second programmable digital emulator $TPE_2$. The programmable amplifier 42 has a digital input which is not shown in FIG. 3 and can be used to program said amplifier. The analog input of the programmable amplifier 42 is connected to the output of the second DA converter $DAC_2$ and its analog output is connected to the input of the RC network RC. The programmable amplifier 42 can be used to change the absolute amplitude of the analog data stream 34 in order to check the input sensitivity of the receiver RX.

Different parameters can be set by changing the parameters of the digital filter DF and by changing the gain of the programmable amplifier 42 in order to test the input sensitivity at which the permissible bit error rate is exceeded.

In an exemplary embodiment which is not shown here, the amplifier 42 may also be arranged downstream of the RC network.

The programmable digital interface PDI is connected to the tester via the digital tester channels DTC and can thus be programmed in automated fashion.

The signal-to-noise ratio can be changed using the second integrated circuit $IC_2$.

The second AD converter $ADC_2$ and the second DA converter $DAC_2$ have a resolution of 10 bits for a sampling rate of 105 Msps. They are, for example, of the 10 bit ADC MAX1180 and 10 bit DAC MAX5858 type. The digital filter DF including the coefficients memory CM and the programmable digital interface PDI may be implemented using an FPGA, for example VIRTEX II-Pro from XILINKS.

The output of the first transceiver 2 provides an analog signal having a particular signal shape. This signal shape is described using a digital representation which describes the digital input of the first digital/analog converter $DAC_1$.

In a first embodiment, the driver strength of the driver TX of the first transceiver 2 is tested. In this case, the digital filter DF is programmed using the coefficients memory CM and the programmable digital interface PDI in such a manner that it emulates the behavior of a transmission line. Defined data are then applied to the driver TX of the first transceiver 2 via the digital tester channels DTC, and the second digital data stream 26 which is generated on the basis of the distorted analog data stream 24 received by the receiver RX is measured. The tester which is not shown in FIG. 3 can then be used to determine the bit error rate of the first transceiver 2 to be tested. If this measured bit error rate undershoots a prescribed maximum bit error rate, the driver strength parameter is verified, including the properties of the receiver RX. Otherwise, the first transceiver 2 needs to be sorted out.

In another embodiment, the input sensitivity of the receiver RX of the first transceiver 2 is checked. In this case, the digital filter DF is programmed using the coefficients memory CM and the programmable digital interface PDI in such a manner that a particular signal-to-noise ratio is applied to the digitized data stream 32. The tester then applies predefined data to the driver TX of the first transceiver 2 via the digital tester channels DTC, and the second digital data stream 26 obtained on the basis of the distorted analog data stream 24 is measured. Therefore, the tester can be used to determine the bit error rate of this second digital data stream 26. If the measured bit error rate undershoots the prescribed maximum value, the last method steps are repeated, the tester respectively applying a lower driver power to the driver TX.

The procedure is as follows in another exemplary embodiment which is not shown here. The tester uses a method to reduce the signal-to-noise ratio until the measured bit error rate exceeds a prescribed maximum value.

When a measured bit error rate exceeds the prescribed maximum value for the first time, a determination is made as to whether the applied data are inside or outside a prescribed worst case eye mark, whether the input sensitivity of the receiver RX thus satisfies the prescribed specification or whether said receiver needs to be sorted out.

These test methods may also be referred to as pseudoparametric test methods.

FIG. 4 shows a third test arrangement 5 having a second load board 51.

The first transceiver 2 and a further programmable digital emulator, which is composed of the fourth integrated circuit $IC_4$ and the RC network RC, are formed on the second load board 51. In this case, the second AD converter $ADC_2$, the digital filter DF, the coefficients memory CM, the programmable digital interface PDI and the second DA converter $DAC_2$ are provided in a common fourth integrated circuit $IC_4$. The converters and the logic unit, which is implemented using the field programmable gate array, are thus situated in a common integrated circuit $IC_4$. This total integration makes it possible to achieve far higher processing speeds than is the case in the discrete design shown in FIG. 3.

Figure 5:
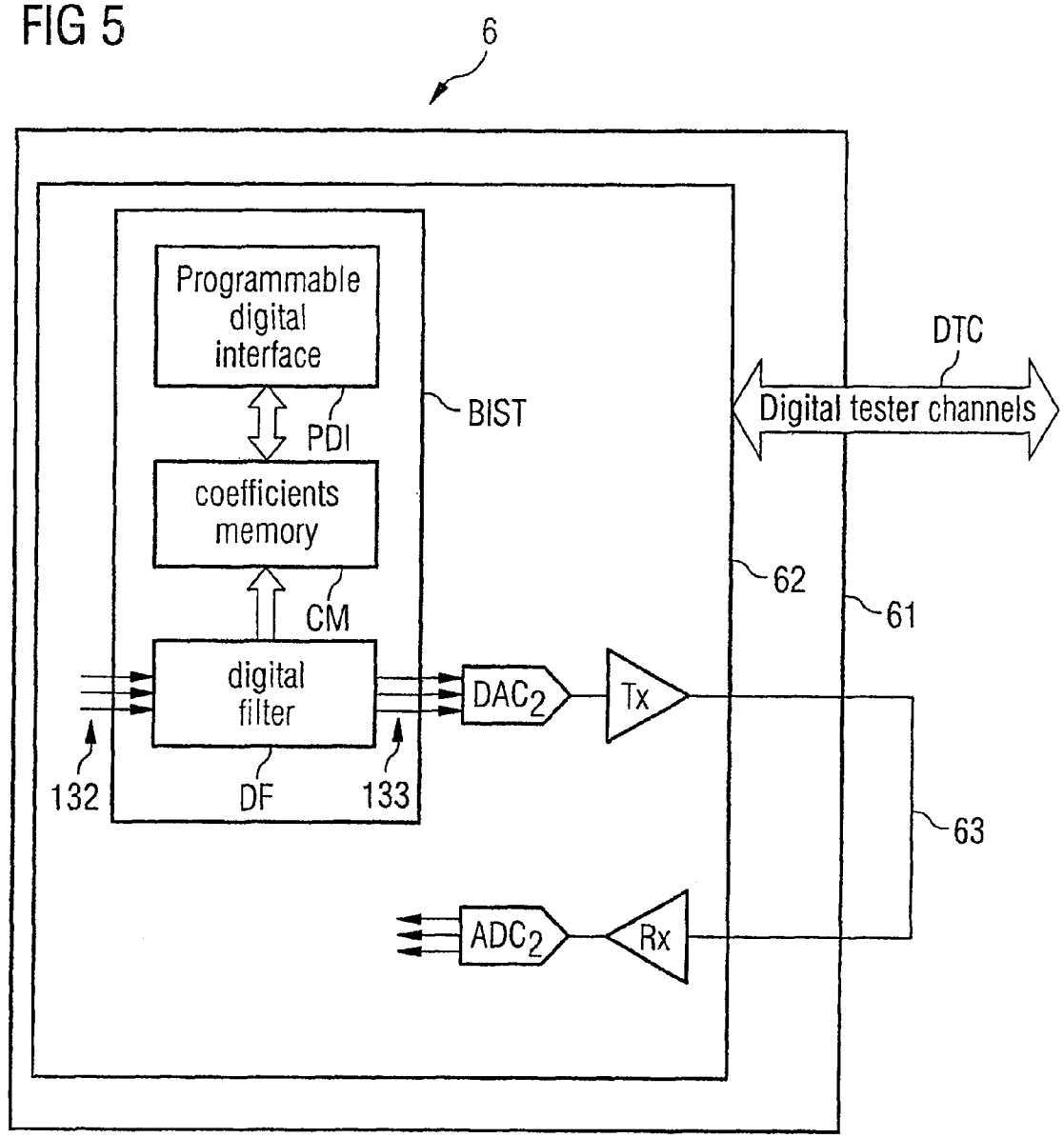
FIG. 5 shows a diagrammatic illustration of a fourth test arrangement having a third load board on which a second transceiver is arranged.

FIG. 5 shows a fourth test arrangement 6 having a third load board 61 on which a second transceiver 62 to be tested is arranged.

An integrated self-test circuit BIST is monolithically integrated in the second transceiver 62. This self-test circuit BIST is composed of the digital filter DF, the coefficients memory CM and the programmable digital interface PDI. The digital filter DF is situated in the internal signal path of the second transceiver 62, to be precise in such a manner that the output of the digital filter DF is connected to the input of the second DA converter $DAC_2$. The digital filter DF processes an internal digital data stream 132 to form an internal digital data stream 133 which has been provided with defined distortion. The distortion is "pulse shaped" in the sense that it constitutes a digital representation of an analog data stream. This analog data stream is formed in such a manner that, after passing through the digital filter DF, a very accurately approximated desired signal is produced, that is to say is reshaped in accordance with the respective requirements. The second transceiver 62 is connected, via the digital tester channels DTC, to a tester (not shown here) which is used to apply data to the second transceiver 62 and to generate measured values.

A direct connecting line 63 is provided on the third load board 61 between the driver TX and the receiver RX. Apart from this, further components are no longer required on the third load board 61.

In the case of the fourth test arrangement 6, the line emulation unit is completely integrated in the second transceiver. This on-chip arrangement of the digital line emulator in the form of a self-test circuit BIST makes it possible to achieve the highest possible data rates, for which reason the fourth test arrangement 6 is also suitable for use in high-speed interfaces.

The invention is also realized in the following combinations of features.

Integrated test circuit in which such an electronic test circuit is monolithically integrated.

Integrated test circuit as above, the digital filter (DF), the coefficients memory (CM) and the programmable digital interface (PDI) being in the form of a field programmable gate array ($IC_2$).

Needle card for testing integrated circuits or ICs, the needle card having an integrated test circuit ($IC_2$, $IC_4$) as above and an analog low-pass filter (ALPF).

Needle card as above,
the digital filter (DF), the coefficients memory (CM) and the programmable digital interface (PDI) being formed in a common integrated test circuit ($IC_2$), and
the analog/digital converter ($ADC_2$) and the digital/analog converter ($DAC_2$) being formed in respective separate integrated circuits ($IC_1$, $IC_3$).

Load board for holding a needle card for testing integrated circuits or ICs and/or having one or more test receptacles for testing integrated circuits or ICs and/or for connecting a converter to a measuring unit for testing integrated circuits or ICs, the load board (41, 51, 61) having an integrated test circuit ($IC_2$, $IC_4$) as above and an analog low-pass filter (ALPF).

Load board as above,
the digital filter (DF), the coefficients memory (CM) and the programmable digital interface (PDI) being formed in a common integrated test circuit ($IC_2$), and
the analog/digital converter ($ADC_2$) and the digital/analog converter ($DAC_2$) being formed in respective separate integrated circuits ($IC_1$, $IC_3$).

Measuring unit having measurement sensors, in particular for currents and voltages, and having instruments for generating digital signals, which are intended to be processed further using a computer system that is connected to the measuring unit, from the measured values, in particular currents and voltages, the measuring unit having an integrated test circuit ($IC_2$, $IC_4$) as above and an analog low-pass filter (ALPF).

Measuring unit as above,
the digital filter (DF), the coefficients memory (CM) and the programmable digital interface (PDI) being formed in a common integrated test circuit ($IC_2$), and
the analog/digital converter ($ADC_2$) and the digital/analog converter ($DAC_2$) being formed in respective separate integrated circuits ($IC_1$, $IC_3$).

Computer system for receiving digital signals which are generated by a measuring unit, the computer system having an integrated test circuit ($IC_2$, $IC_4$) as above and an analog low-pass filter (ALPF).

Computer system as above,
the digital filter (DF), the coefficients memory (CM) and the programmable digital interface (PDI) being formed in a common integrated test circuit ($IC_2$), and the analog/digital converter ($ADC_2$) and the digital/analog converter ($DAC_2$) being formed in respective separate integrated circuits ($IC_1$, $IC_3$).

Integrated circuit, in particular transceiver, having such an electronic test circuit.

What is claimed is:

1. An electronic test circuit for an integrated circuit to be tested, the integrated circuit to be tested being a transceiver, the electronic test circuit comprising:
    an input configured to receive a first analog data stream from a driver of the transceiver,
    a programmable digital line emulator configured to emulate properties of a transmission path, wherein the programmable digital line emulator is configured to receive the first analog data stream from the input;
    an output configured to emit a second analog data stream having a signal-to-noise ratio, wherein the programmable digital line emulator is configured to adjust the signal-to-noise ratio of the second analog data stream, the output being connected to an input of the transceiver.

2. The electronic test circuit according to claim 1, wherein the programmable digital line emulator has a digital filter configured to process a digital or digitized data stream to form a digital data stream.

3. The electronic test circuit according to claim 2, further comprising a coefficients memory and a programmable digital interface, the digital filter being adjustable using the coefficients memory and the programmable digital interface.

4. The electronic test circuit according to claim 2, wherein the programmable digital line emulator also has an analog/digital converter configured to convert the first analog data stream into a digitized data stream for the digital filter and a digital/analog converter configured to convert the digitized data stream from the digital filter into a third analog data stream.

5. The electronic test circuit according to claim 4, wherein the input of the analog/digital converter is connected to a driver of the transceiver.

6. The electronic test circuit according to claim 4, wherein the programmable digital line emulator also has an analog low-pass filter configured to process the third analog data stream to so as to output a low-pass-filtered analog output data stream.

7. The electronic test circuit according to claim 6, wherein the output of the analog low-pass filter is connected to an input of a receiver of the transceiver.

8. The electronic test circuit according to claim 4, wherein the digital/analog converter comprises a programmable amplifier.

9. The electronic test circuit according to claim 4, further comprising a programmable amplifier connected downstream of the digital/analog converter or downstream of the analog low-pass filter.

10. The electronic test circuit according to claim 1, wherein the electronic test circuit is monolithically integrated in an integrated test circuit.

11. The electronic test circuit according to claim 10, wherein the digital filter, the coefficients memory and the programmable digital interface are in the form of a field programmable gate array.

12. The electronic test circuit according to claim 10, wherein the electronic test circuit is integrated on a load board having one or more test receptacles for testing integrated circuits or ICs or for holding semiconductor wafers, the load board having the integrated test circuit.

13. The electronic test circuit according to claim 12, wherein the digital filter, the coefficients memory and the programmable digital interface are formed in a common integrated test circuit, and the analog/digital converter and the digital/analog converter are formed in respective separate integrated circuits.

14. The electronic test circuit according to claim 1, wherein the electronic test circuit is integrated in the tester instrumentation.

15. A method for testing a driver strength of a driver of an integrated circuit to be tested, said method comprising:
    a) providing
        an electronic test circuit and connecting the electronic test circuit to the integrated circuit to be tested by connecting the driver of the integrated circuit to be tested to an input of a programmable digital line emulator and connecting a receiver of the integrated circuit to be tested to an output of the electronic test circuit,
    b) adjusting the programmable digital line emulator to a desired load behavior,
    c) applying data to the driver of the integrated circuit to be tested,
    d) using the receiver of the integrated circuit to be tested to detect an analog data stream and using the integrated circuit to be tested to detect a bit error rate, and
    e) sorting out the integrated circuit to be tested responsive to a predetermined maximum bit error rate being exceeded.

16. The method according to claim 15, wherein steps c) and d) are carried out several times in succession, the driver power being gradually lowered or raised.

17. A method for testing an input sensitivity of a receiver of an integrated circuit to be tested, said method comprising:
    a) providing
        an electronic test circuit and connecting the electronic test circuit to the integrated circuit to be tested, or
        the integrated circuit to be tested and connecting the integrated circuit to be tested to a load board,
    b) adjusting a programmable digital line emulator in such a manner that a digital or digitized data stream is processed to form a digital data stream having a desired signal-to-noise ratio,
    c) applying data to a driver of the integrated circuit to be tested,
    d) using a receiver of the integrated circuit to be tested to detect an analog data stream and using the integrated circuit to be tested to detect a bit error rate, and
    e) sorting out the integrated circuit to be tested responsive to a predetermined maximum bit error rate being exceeded.

18. The method according to claim 17, wherein the electronic test circuit has a programmable amplifier, the method further comprising adjusting the amplifier power of the programmable amplifier.

19. An electronic test circuit for a transceiver to be tested, the electronic test circuit comprising:
    a receiver comprising input configured to receive a first analog data stream,
    a driver configured to output a second analog output stream, and
    a programmable digital line emulator configured to emulate properties of a transmission path, to receive the second analog output stream from the driver, to emit the first analog data stream, and to adjust a signal-to-noise ratio of the first analog data stream.

20. The electronic test circuit according to claim 19, further comprising a coefficients memory and a programmable digital interface, wherein
    the programmable digital line emulator has a digital filter configured to process a digital or digitized data stream to form a digital data stream;

the digital filter is adjustable using the coefficients memory and the programmable digital interface; and the programmable digital line emulator also has an analog/digital converter configured to convert the second analog input data stream into the digital or digitized data stream for the digital filter, and further has a digital/analog converter configured to convert a digital data stream of the digital filter into an analog data stream.

* * * * *